United States Patent
Kim

(10) Patent No.: US 6,636,452 B2
(45) Date of Patent: Oct. 21, 2003

(54) ADDRESS CONTROL APPARATUS OF SEMICONDUCTOR MEMORY DEVICE USING BANK ADDRESS

(75) Inventor: Yong Ki Kim, Kyoungki-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/150,090

(22) Filed: May 20, 2002

(65) Prior Publication Data

US 2002/0172087 A1 Nov. 21, 2002

(30) Foreign Application Priority Data

May 18, 2001 (KR) ......................................... 2001-27150

(51) Int. Cl.[7] ................................................. G11C 8/00
(52) U.S. Cl. ............................. 365/230.02; 365/230.06
(58) Field of Search ............................ 365/222, 230.02, 365/230.06, 233

(56) References Cited

U.S. PATENT DOCUMENTS

| | | | |
|---|---|---|---|
| 4,195,238 A | 3/1980 | Sato | 307/270 |
| 4,451,908 A | 5/1984 | Takemae et al. | 305/222 |
| 5,546,352 A | 8/1996 | Sato et al. | 365/230.06 |
| 5,761,694 A | 6/1998 | Rao | 711/5 |
| 5,815,460 A | 9/1998 | Watanabe | 365/230.06 |
| 6,166,988 A | 12/2000 | Ryu et al. | 365/230.08 |
| 6,262,923 B1 * | 7/2001 | Fujita | 365/200 |

* cited by examiner

*Primary Examiner*—M. Tran
(74) *Attorney, Agent, or Firm*—Jacobson Holman PLLC

(57) ABSTRACT

An address control apparatus for a semiconductor memory device using a bank address, and more particularly an address control apparatus for a semiconductor memory device using a bank address being concurrently used as a row address in accordance with an architectural bank in realizing various dynamic random access memory (DRAM) macro sets more than 2M~64M, utilizing a memory compiler in embedded-DRAM, resulting in reduced design time for the macro sets with a minimum of circuit elements.

10 Claims, 4 Drawing Sheets

ADDRESS CONTROL APPARATUS OF SEMICONDUCTOR MEMORY DEVICE USING BANK ADDRESS

FIELD OF THE INVENTION

The present invention generally relates to an address control apparatus for a semiconductor memory device using a bank address, and more specifically to an address control apparatus which can be applied to various DRAM macro sets more than 2M~64M, as well as reducing the time required for designing the macro sets.

BACKGROUND OF THE INVENTION

In general, address buffers in a DRAM device perform to receive address signals. Each address signal(e.g., A0 through An) is independently assigned to one address buffer and one address bus line. And, each address signal provided through each address buffer is stored in an address register in synchronization with an internal clock.

Meanwhile, it is generally known in the address buffers that the address signals are inputted thereto synchronously with row active, read, or write commands. In cases where the address signals are performing a multiplexing operation, the address signals may be used for a row address or a column address in accordance with the kinds of commands. In cases without the multiplex procedure, i.e., de-multiplexing, the address signals are classified into row and column address signals at the time they are incoming, and then provided to the address buffers in response to activation of row and column signals. At this time, the row and column address signals are converted into pre-decoded signals by row and column pre-decoders, respectively.

FIG. 1 is a block diagram of the conventional demultiplexing address control apparatus for receiving the row and column address signals which are separately input thereto.

Referring to FIG. 1, the conventional address control unit includes a row address buffer 10, a column address buffer 30, and a bank address buffer 50, theses three buffers being associated with their own signal input paths.

First, the row address buffer 10 receives and buffers external row address signals RAN<0:10>, and then generates internal row address signals RA<0:10> and /RA<0:10>. The internal row address signals RA<0:10> and /RA<0:10> are applied to a row pre-decoder 20 and converted into pre-decoded row address signals. At that time, first refresh control unit 15 applies control signals RCNT<0:10> and /RCNT<0:10> to the row pre-decoder 20 in response to clock signal CLK in order to control a refresh operation.

The column address buffer 30 receives and buffers external column address signals CAN<0:4>, and then generates internal column address signals CA<0:4> and /CA<0:4>. The internal column address signals CA<0:4> and /CA<0:4> are applied to a column decoder 40 and converted into decoded column address signals.

The bank address buffer 50 receives and buffers external bank address signals BAN<0:1>, and then generates internal bank address signals BA<0:1> and /BA<0:1>. The internal bank address signals BA<0:1> and /BA<0:1> are applied to a bank control unit 60. Here, the bank address signals serve to activate a selected bank in multi-bank DRAM.

However, according to the conventional address control apparatus, since the row address buffer 10, the column address buffer 30, and the bank address buffer 50 respectively should have their own signal input paths to buffer the address signals, a time required for designing a DRAM macro set inevitably increases. Such a long time for design makes it difficult to completely fabricate the DRAM macro set in a given turn-around-time (TAT).

As a result, it would be difficult to design DRAM macro sets having various memory densities of 2M through 64M because of the numerous signal paths for the buffers.

SUMMARY OF THE INVENTION

It is, therefore, an object of the present invention to utilize a bank address as a row address in accordance with a bank architecture.

In order to attain the above object, according to an aspect of the present invention, it is an object of the present invention to provide an address control apparatus for a semiconductor memory device using a bank address, the address control unit including a row address buffer for buffering and generating a row address signal, a bank address buffer for buffering and generating a bank address signal, a bank control unit for activating a bank selected in response to the buffered bank address signal provided from the bank address buffer, an address control unit for converting the buffered bank address signal provided from the bank address buffer into an additional row address signal, and then generating, and a row pre-decoder for pre-decoding the buffered row address signal provided from the row address buffer and the additional row address signal converted in the address control unit, and then generating a composite address signal.

BRIEF DESCRIPTION OF THE DRAWINGS

The above and other objects, features and advantages of the present invention will become more apparent from the following detailed description when taken in conjunction with the accompanying drawings in which.

DESCRIPTION OF THE PREFERRED EMBODIMENT

Figure 1:
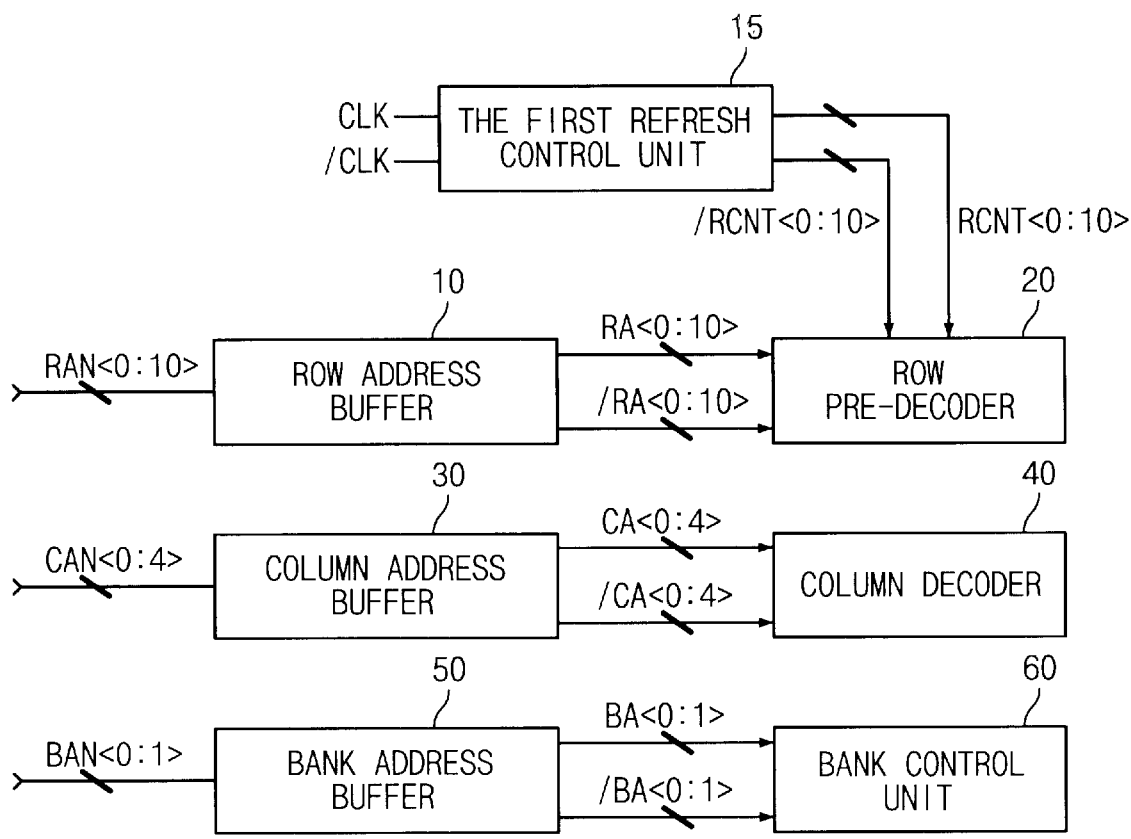
FIG. 1 is a block diagram of an address control apparatus of a semiconductor memory device according to the conventional art.
Figure 2:
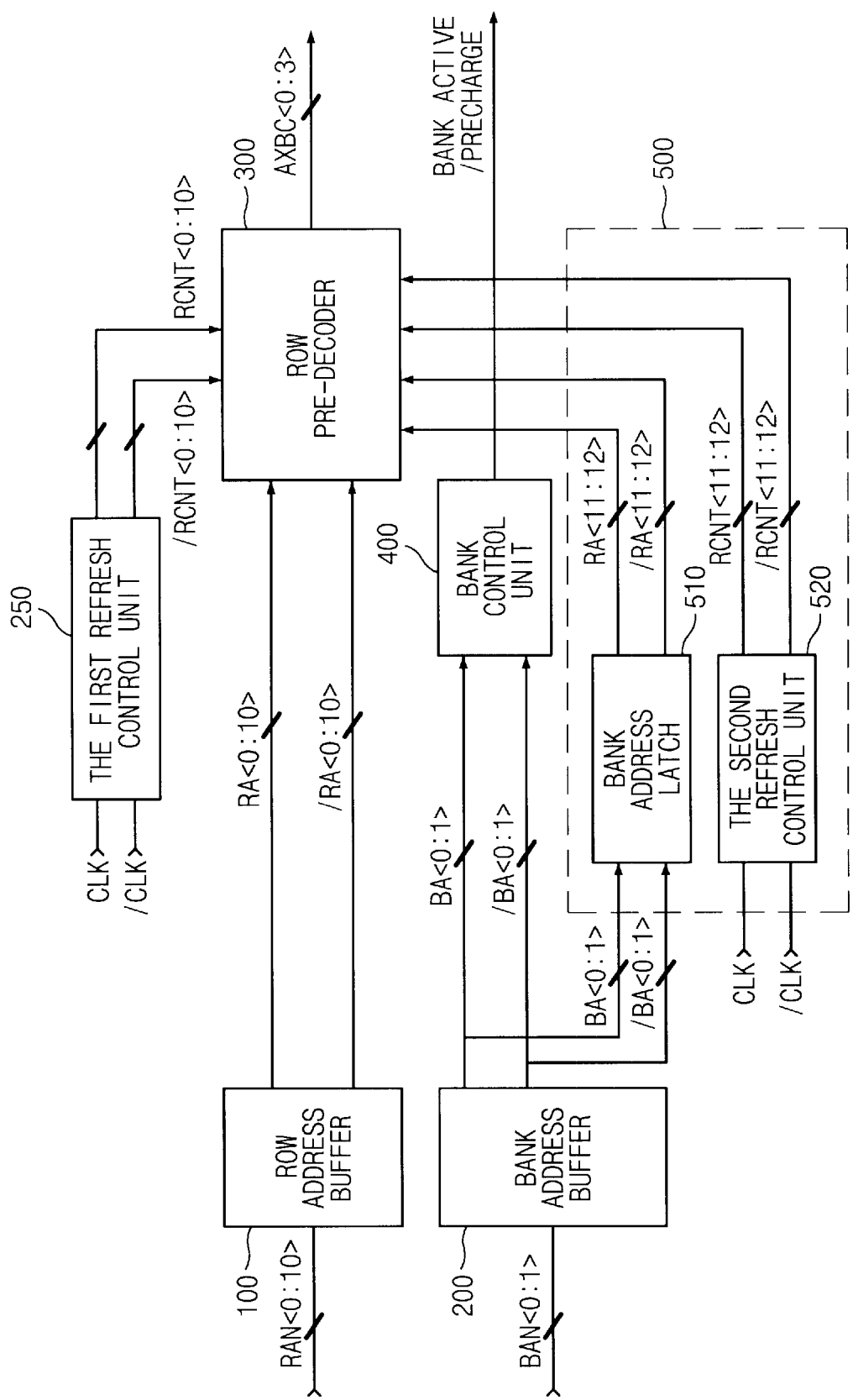
FIG. 2 is a block diagram of an address control apparatus of a semiconductor memory device using a bank address according to a preferred embodiment of the present invention.

FIG. 2 depicts an address control apparatus for a semiconductor memory device according to a preferred embodiment of the present invention.

The address control apparatus according to the present invention includes a bank address latch 510, and a second refresh control unit 520, which are not found in the conventional address control apparatus. Also, contrary to the conventional one, the inventive address control apparatus has a row pre-decoder 300 which receives the band address as well as the row address.

As shown in FIG. 2, a row address buffer 100 receives and buffers external row address signals RAN<0:10>, and then generates internal row address signals RA<0:10> and /RA<0:10> to the row pre-decoder 300. A first refresh control unit 250 applies control signals RCNT<0:10> and /RCNT<0:10> for controlling refresh to the row pre-decoder 300 in synchronization with clock signals CLK and /CLK. A bank address buffer 200 receives and buffers external bank address signals BAN<0:1>, and then generates internal bank address signals BA<0:1> and /BA<0:1> to a bank control unit 400. Here, the bank address signals (e.g., BA0~BA1) are address signals to determine which bank is set to be activated in multi-bank DRAM. The bank control unit 400 receives the bank address signals BA<0:1> and /BA<0:1> provided from the bank address buffer 200, and generates a signal for activating a selected bank, and a precharge signal.

In the present invention, the bank address is used in parallel with the row address in accordance with the bank architecture, considering the layout and construction. Thus, in order to utilize the bank address signal in parallel with additional row address signals (e.g., RAN<11:12>), the bank address latch 510 which latches the bank address signal provided from the bank address buffer 200 is employed.

For instance, in the case where row address signals A0~A12 are provided and the bank address signal is used in parallel with the row address signal, the address signals A0~A10 are used for the row address signals, and the additional row address signals of A11 and A12 are used for the bank address signals.

In other words, the external row address signals RAN<0:10> are applied through the row address buffer 100 to the row pre-decoder 300, and the additional row address signals are applied through the bank address buffer 200 to the row pre-decoder 300.

For the purpose of utilizing the external bank address signals BAN<0:1> as the additional row address signal, the internal bank address signals BA<0:1> and /BA<0:1> provided from the bank address buffer 200 are applied to the bank address latch 510 of an address control unit 500.

The bank address latch 510 latches the internal bank address signals BA<0:1> and /BA<0:1>, and generates the additional row address signals RA<11:12> and /RA<11:12>. The additional row address signals RA<11:12> and /RA<11:12> are applied to the row pre-decoder 300 and converted into decoded row address signals.

Further, the second refresh control unit 520 of the address control unit 500 applies control signals RCNT<11:12> and /RCNT<11:12> to the row pre-decoder 300 in response to the clock signals CLK and /CLK in order to refresh the row address signals RA<11:12> and /RA<11:12> provided in the row pre-decoder 300 through the bank address latch 510. The row address signals RA<0:12> and /RA<0:12> provided in the row pre-decoder 300 are converted to pre-decoded row address signals AXBC<0:3>.

The bank address buffer 200 serves to select a building block below a unit of basic memory block for tiling a memory compiler. Thus, the external row address signals RAN<0:1>, RAN<9:10> being used for selecting word line driving signals, and a memory core cell block are utilized for bank address latch control signals and fast control signals.

The embodiment of the invention is a case of tiling the building block of a memory compiler 4M core cell, and the building block is selected by allowing the bank address buffer 200 to generate the row address signal.

In the case of tiling a building block of 2M core cell, the bank address latch 510 is added to each of three address buffers of the bank address signals BAN<0:2>.

Figure 3:
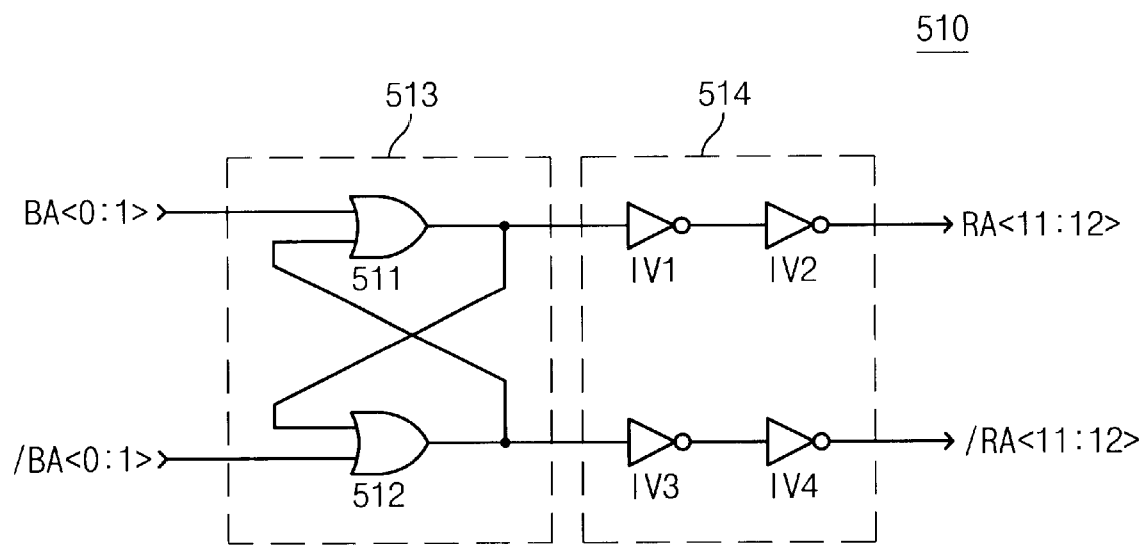
FIG. 3 is a circuit diagram of a bank address latch according to the preferred embodiment of the present invention.

FIG. 3 is a circuit diagram of the bank address latch 510 using the bank address.

Referring to FIG. 3, the bank address signals BA<0:1> and /BA<0:1> applied from the bank address buffer 200 shown in FIG. 2 are applied to a flip-flop unit 513, and respectively become input signals for a first OR gate 511 and a second OR gate 512.

Here, an output signal of the first OR gate 511 is applied to an input of the second OR gate 512, and an output signal of the second OR gate 512 is applied to an input of the first OR gate 511. The output signals being logically operated in the flip-flop unit 513 are respectively applied to non-inverted inverters IV1 and IV2, and IV3 and IV4 in a delay unit 514, delayed, and converted into the additional row address signals RA<11:12> and /RA<11:12>.

In the case of designing a two-bank device, the external bank address signal BAN<0> is used for the bank address signal, and the external bank address signal BAN<1> is used for the additional row address signal. Meanwhile, in the case of a single bank device, all the external bank address signals BAN<0:1> are used for the additional row address signals, for example, RA<11:12> and /RA<11:12> in selecting the building block of the 4M core cell.

Figure 4:
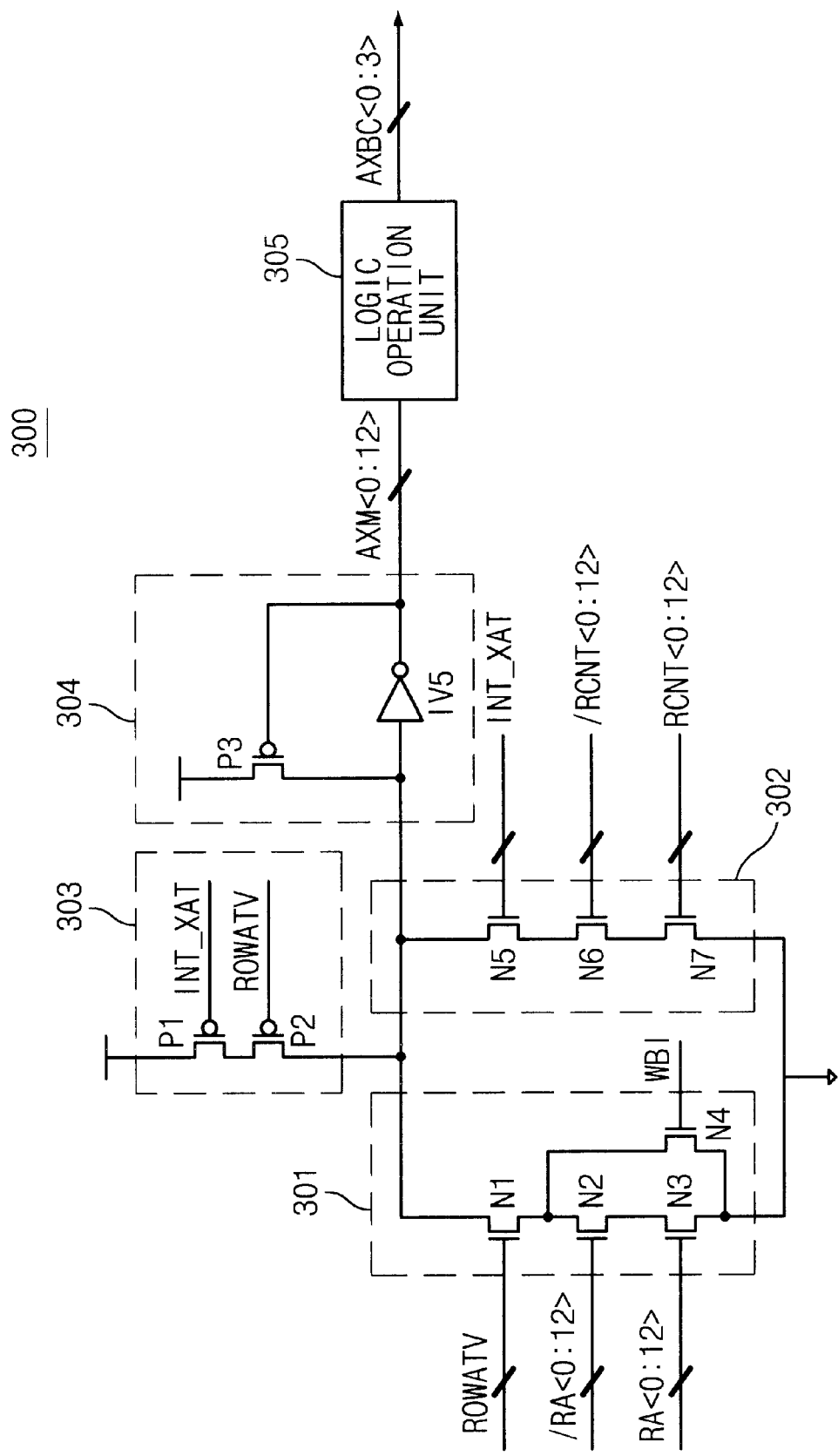
FIG. 4 is a circuit diagram of a row pre-decoder according to the preferred embodiment of the present invention.

FIG. 4 is a circuit diagram of the row pre-decoder 300 for selecting (2M/4M) memory compiler tiling unit building block.

Referring to FIG. 4, in a decode unit 301 of the row pre-decoder 300, NMOS transistors N1, N2, and N3 are serially connected, and respectively coupled to a row active command signal ROWATV, the row address signals RA<0:12> and /RA<0:12> provided from the row address buffer 100 and the bank address buffer 200 shown in FIG. 2 through gates.

A NMOS transistor N4 is connected between the NMOS transistors N2 and N3, and has a gate to which a wafer burn-in signal WBI is applied. A NMOS transistor N5 in a refresh unit 302 is connected to the NMOS transistor N1 in parallel, and has a gate to which a refresh command signal INT_XAT is applied. Further, NMOS transistors N6 and N7, serially connected between the NMOS transistor N5 and ground voltage, have gates each of which receives the refresh control signals RCNT<0:12> and /RCNT<0:12> applied from the first and second refresh control units 250 and 520 shown in FIG. 2.

In a control unit 303, PMOS transistors P1 and P2 are serially connected between the power supply voltage and a common drain terminal to which the NMOS transistors N1 and N5 are connected, and have gates to which the refresh command signal INT_XAT and the row active command signal ROWATV are respectively applied. In a drive unit 304, an inverter IV5 is connected to a common drain terminal of the NMOS transistors N1 and N5, and generates a pre-decoding signal AXM<0:12> of the row pre-decoder 300 through an output terminal thereof. Here, both ends of the inverter IV5 are respectively coupled to drain and gate terminals of a PMOS transistor P3. The pre-decoding signal AXM<0:12> provided from the drive unit 304 is converted into the composite row address signals AXBC<0:3> through a logic operation unit 305.

Here, in the case of selecting a block in a normal operation, the NMOS transistors N1, N2, and N3, serially connected in the decode unit 301, input the row address signals RA<0:12>, /RA<0:12>, and the row active command signal ROWATV in order to minimize the effect of a charge share in operation.

Further, for the purpose of activating all the blocks in a wafer burn-in mode, the NMOS transistor N4 is connected in parallel.

In accordance with the foregoing description, the address control apparatus of the semiconductor memory device using the bank address can flexibly realize the density of row/high (2M~64M) embedded-DRAM as well as reducing design time in employing the memory compiler.

In other words, the design time can be remarkably reduced by utilizing the bank address in parallel with the row address in accordance with the bank architecture, considering the optimum layout and the minimum modification of the circuit appropriate for the DRAM compiler.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. An address control apparatus for a semiconductor memory device using a bank address, the address control apparatus comprising:
    a row address buffer for buffering and generating a row address signal;
    a bank address buffer for buffering and generating a bank address signal;
    a bank control unit for activating a selected bank in response to the buffered bank address signal provided from the bank address buffer;
    an address control unit for converting the buffered bank address signal provided from the bank address buffer into an additional row address signal, and then generating the additional row address signal; and
    a row pre-decoder for pre-decoding the buffered row address signal provided from the row address buffer and the converted additional row address signal provided from the address control unit, and then generating a composite row address signal.

2. The address control apparatus of claim 1, further comprising: a bank address latch for latching the buffered bank address signal provided from the bank address buffer, and then generating the additional row address signal.

3. The address control apparatus of claim 2, further comprising a refresh control unit for generating a control signal controlling a refresh operation for the additional row address signal converted in the bank address latch.

4. The address control apparatus of claim 2, wherein the bank address latch comprises:
    a flip-flop unit for performing a logic operation on the buffered bank address signal, and generating the additional row address signal; and
    a delay unit with an input and for delaying and generating the additional row address signal provided from the flip-flop unit.

5. The address control apparatus of claim 4, wherein the flip-flop unit comprises a pair of OR gates which input bank address signals provided from the bank address buffer and output them cross-coupled to the input of the delay unit.

6. The address control apparatus of claim 4, wherein the lay unit comprises a non-inverted inverter.

7. The address control apparatus of claim 1, wherein the row pre-decoder comprises:
    a decode unit for pre-decoding and generating the buffered row address signal and the additional row address signal in response to a row active command signal;
    a refresh unit for pre-decoding and generating a refresh signal applied from the row address buffer and a refresh signal applied from the address control unit in response to a refresh command signal;
    a control unit for selectively controlling the decode unit and the refresh unit in response to the row active command signal and the refresh command signal;
    a drive unit for latching and generating the pre-decoded signal in response to a command signal provided from the control unit; and
    a logic operating unit for performing a logic operation of the output signal applied from the drive unit, and then generating the composite row address signal.

8. The address control apparatus of claim 7, wherein the decode unit comprises:
    a plurality of switch elements serially connected, and respectively coupled to the row address signal and the row active command signal through gate terminals; and
    a switch element connected to the plurality of switch elements in parallel, and inputted with a wafer burn-in signal through a gate terminal.

9. The address control apparatus of claim 7, wherein the refresh unit comprises a plurality of switch elements serially connected and respectively inputted with the refresh signal and the refresh command signal through gate terminals.

10. The address control apparatus of claim 7, wherein the control unit comprises a plurality of switch elements whose gates are respectively inputted with the refresh command signal and the row active command signal for selectively controlling outputs of the decode unit and the refresh unit.

\* \* \* \* \*